(12) United States Patent
Tsai

(10) Patent No.: US 11,418,229 B2
(45) Date of Patent: Aug. 16, 2022

(54) WIRELESS SWITCH CONTROL DEVICE AND METHOD

(71) Applicant: UNIVERSAL SCIENTIFIC INDUSTRIAL ( SHANGHAI ) CO., LTD., Shanghai (CN)

(72) Inventor: Ming-Chang Tsai, Shanghai (CN)

(73) Assignee: UNIVERSAL SCIENTIFIC INDUSTRIAL (SHANGHAI) CO., LTD., Shanghai (CN)

(*) Notice: Subject to any disclaimer, the term of this patent is extended or adjusted under 35 U.S.C. 154(b) by 287 days.

(21) Appl. No.: 16/823,425

(22) Filed: Mar. 19, 2020

(65) Prior Publication Data

US 2021/0226657 A1 Jul. 22, 2021

(30) Foreign Application Priority Data

Jan. 19, 2020 (CN) .......................... 202010058386.7

(51) Int. Cl.
*H04B 1/16* (2006.01)
*H02J 50/80* (2016.01)
*H04W 4/80* (2018.01)
*H05K 1/18* (2006.01)

(52) U.S. Cl.
CPC ............ *H04B 1/1615* (2013.01); *H02J 50/80* (2016.02); *H04W 4/80* (2018.02); *H05K 1/189* (2013.01)

(58) Field of Classification Search
CPC ........ H04B 1/1615; H02J 50/80; H04W 4/80; H05K 1/189
See application file for complete search history.

(56) References Cited

U.S. PATENT DOCUMENTS

| 2014/0266779 | A1* | 9/2014 | Grothaus | .............. | H04W 12/04 340/870.02 |
| 2018/0287417 | A1* | 10/2018 | Zeine | ..................... | H02J 50/402 |
| 2020/0366197 | A1* | 11/2020 | Mahendra | .............. | G01D 11/00 |

FOREIGN PATENT DOCUMENTS

| CN | 103631229 | A | | 3/2014 | | |
| CN | 105576771 | A | | 5/2016 | | |
| CN | 106486626 | A | | 3/2017 | | |
| CN | 206480660 | U | | 9/2017 | | |
| CN | 109416991 | A | * | 3/2019 | ............. | G05G 1/105 |
| CN | 109786871 | A | | 5/2019 | | |
| CN | 209418593 | U | | 9/2019 | | |
| WO | WO-2010032333 | A1 | * | 3/2010 | ............. | H02M 1/32 |

\* cited by examiner

*Primary Examiner* — Elton Williams
(74) *Attorney, Agent, or Firm* — Li & Cai Intellectual Property (USA) Office

(57) ABSTRACT

A wireless switch control device and method are provided. The wireless switch control device includes a flexible printed circuit (FPC) board, a load switch, and a wireless control circuit. The FPC board has a first electrode region, a second electrode region, and a component placement region, where the first electrode region is in electrical contact with an anode of the battery module, and the second electrode region is in electrical contact with a cathode of the battery module. The load switch is provided in the component placement region, and coupled to a power supply circuit between the battery module and the electronic product. The wireless control circuit is provided in the component placement region, and coupled to both the load switch and the anode of the battery module. The wireless control circuit receives a setting instruction wirelessly, and controls the load switch according to the setting instruction.

8 Claims, 6 Drawing Sheets

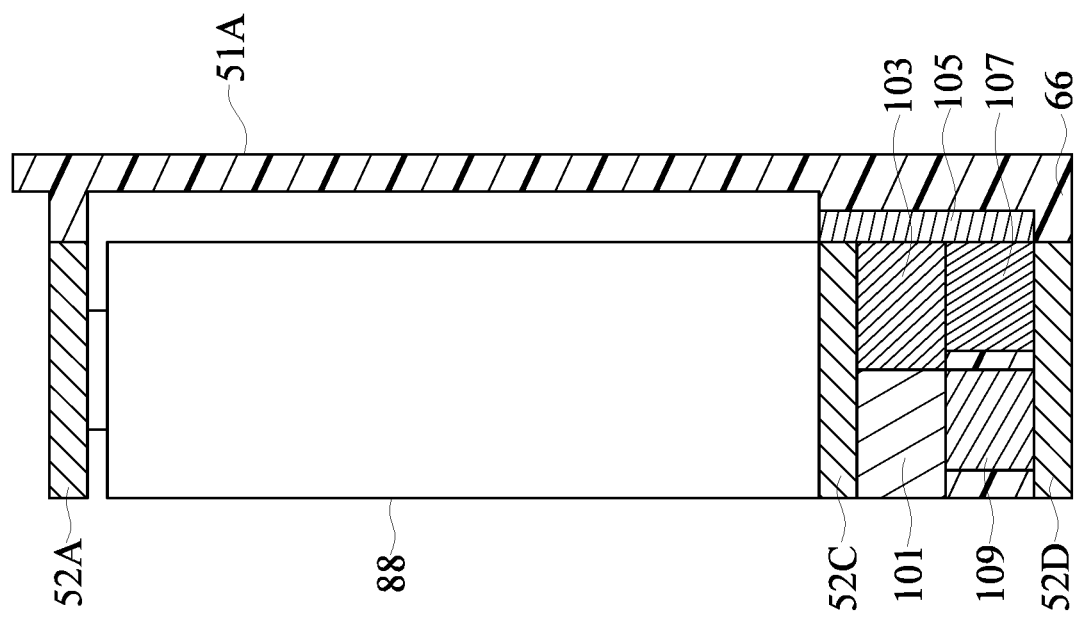

WIRELESS SWITCH CONTROL DEVICE AND METHOD

CROSS-REFERENCE TO RELATED PATENT APPLICATION

This application claims the benefit of priority to No. 202010058386.7, filed on Jan. 19, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a Bluetooth® Low Energy (BLE) tracker, and more particularly to a wireless switch control device and method.

BACKGROUND OF THE DISCLOSURE

As none of conventional electronic products using dry batteries, for example, toys or remote controls, have a wireless control function, it is not possible for these electronic products to be powered on/off wirelessly. As a result, a user is unable to set a usage time of the electronic product in advance, and also cannot deal with electrolyte leakage from the dry batteries in real time after they are placed in a conduction mode in a battery compartment for a long time or an abnormal current in the electronic product. The conventional electronic products do not have a wireless control function, thus resulting in inconvenience.

SUMMARY OF THE DISCLOSURE

In response to the above-referenced technical inadequacies, the present disclosure provides a wireless switch control device. The wireless switch control device is arranged outside of a battery module and is used to control power supply from the battery module to an electronic product.

In one aspect, the present disclosure provides a wireless switch control device, including: a flexible printed circuit (FPC) board, a load switch, and a wireless control circuit. The FPC board has a first electrode region, a second electrode region, and a component placement region, where the first electrode region is in electrical contact with an anode of the battery module, and the second electrode region is in electrical contact with a cathode of the battery module. The load switch is provided in the component placement region, and coupled to a power supply circuit between the battery module and the electronic product. The wireless control circuit is provided in the component placement region, and coupled to both the load switch and the anode of the battery module. The wireless control circuit receives a setting instruction wirelessly, and controls the load switch according to the setting instruction.

In another aspect, the present disclosure provides a wireless switch control method. The wireless switch control method is applicable to a wireless switch control device arranged outside of a battery module. The wireless switch control device is used to control power supply from the battery module to an electronic product, and includes an FPC board, a load switch, and a wireless control circuit. The load switch and the wireless control circuit are provided in a component placement region of the FPC board, and the load switch is coupled to a power supply circuit between the battery module and the electronic product. The wireless switch control method includes: wirelessly receiving, by the wireless control circuit, a setting instruction when a first electrode region and a second electrode region of the FPC board are respectively coupled to an anode and a cathode of the battery module; and controlling the load switch according to the setting instruction.

Therefore, the wireless switch control device having a Bluetooth® function of the present disclosure can control the battery module to supply power to the electronic product, so that the electronic product can be powered on/off wirelessly.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 1B is a schematic diagram showing the arrangement of different components of the wireless switch control device in the battery compartment according to an embodiment of the present disclosure;

DETAILED DESCRIPTION OF THE EXEMPLARY EMBODIMENTS

Figure 1A:
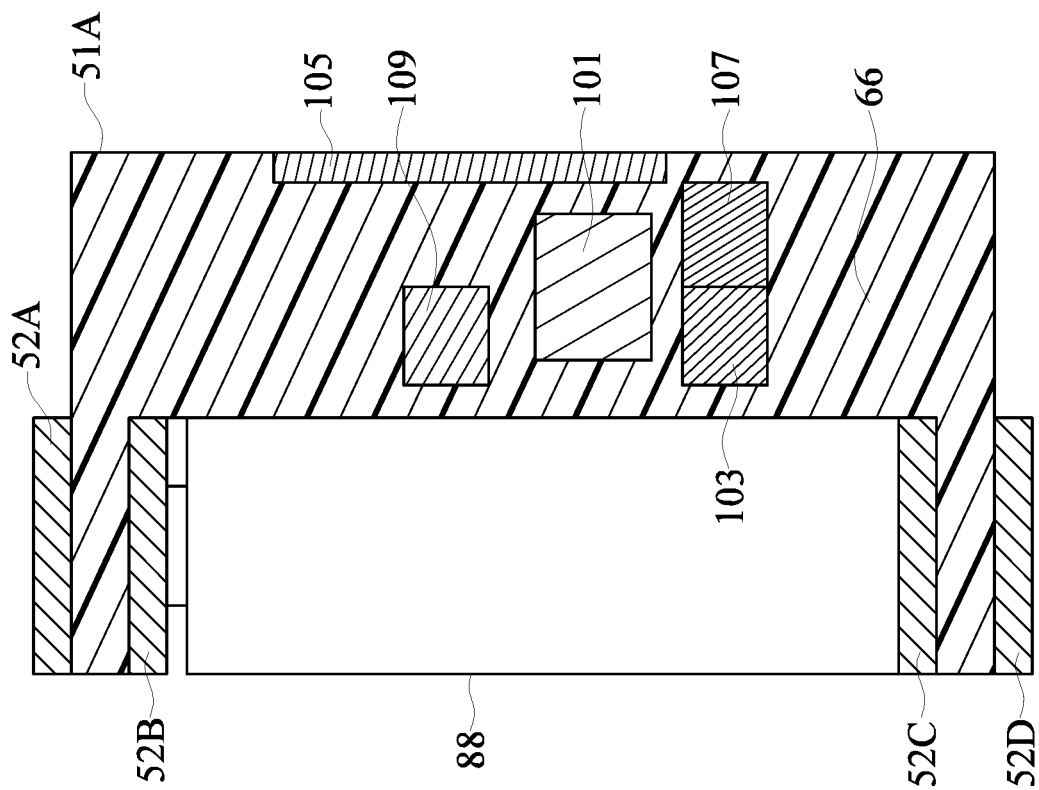
FIG. 1A is a schematic diagram showing an arrangement of different components of a wireless switch control device in a battery compartment according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1C:
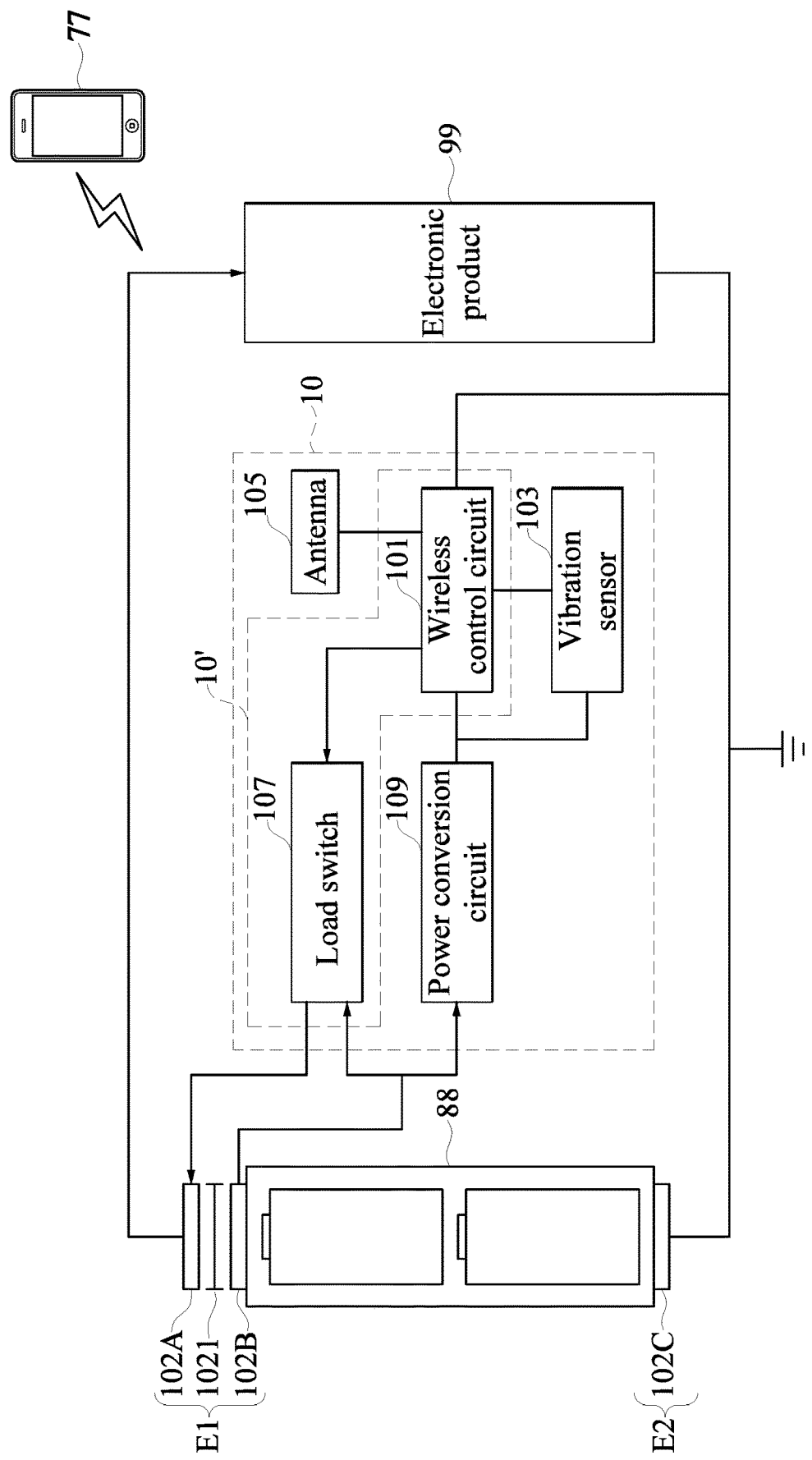
FIG. 1C is a block diagram of the wireless switch control device according to an embodiment of the present disclosure.

The present disclosure may use an FPC board to manufacture a wireless switch control device that can be clamped over the anode and the cathode of a dry battery and can be fitted in an original battery compartment. Referring to FIG. 1A and FIG. 1C, FIG. 1A is a schematic diagram showing an arrangement of different components of a wireless switch control device 10 in a battery compartment according to an embodiment of the present disclosure.

In an embodiment, a component placement region 66 is formed between an anode and a cathode of a battery module 88 on an FPC board, and is used to accommodate different components of the wireless switch control device 10. These components include a wireless control circuit 101, a vibration sensor 103, an antenna 105, a load switch 107, a power conversion circuit 109, and a metal sheet. However, in other embodiments, the component placement region 66 may also be arranged at another location in the battery compartment, but the present disclosure is not limited thereto.

Particularly, an overall height of the components of the wireless switch control device 10 must not exceed the sum of heights of the cylinder of the battery module 88 and a residual space of the battery compartment. The residual space has a height of approximately 2.7 mm.

In an embodiment, the wireless switch control device 10 is surrounded by a magnetic first metal sheet 52A and second metal sheet 52B, a magnetic third metal sheet 52C, fourth metal sheet 52D, and an FPC board 51A; and is provided in the component placement region 66.

Particularly, there is no conduction between the first metal sheet 52A and the second metal sheet 52B, and they may be inserted into a circular hole (not shown) in the FPC board 51A. In an embodiment, an insulating part (not shown) is provided between two adjacent sides of the first metal sheet 52A and the second metal sheet 52B.

A first end of the wireless switch control device 10 is connected to the anode of the battery module 88, and a second end thereof is connected to the load switch 107 of the wireless switch control device 10. The battery module 88 is held by the FPC board 51A. A middle projection is provided on the first end of the wireless switch control device 10, and the wireless switch control device 10 can be securely clamped to the anode of the battery module 88 via this middle projection. The cathode of the battery module 88 is electrically connected to the third metal sheet 52C and the fourth metal sheet 52D.

Referring to FIG. 1B and FIG. 1C, FIG. 1B is a schematic diagram showing the arrangement of different components of the wireless switch control device in the battery compartment according to an embodiment of the present disclosure.

In an embodiment, a component placement region 66 is formed between an elastic sheet and a cathode of a battery module 88. The different components of the wireless switch control device 10, including a wireless control circuit 101, a vibration sensor 103, an antenna 105, a load switch 107, a power conversion circuit 109, a third metal sheet 52C, and a fourth metal sheet 52D, are provided in the component placement region 66.

Particularly, there is no conduction between the third metal sheet 52C and the fourth metal sheet 52D. A first metal sheet 52A is electrically connected to an output of the load switch 107 of the wireless switch control device 10 and the cathode of the battery module 88. A grounding terminal of an electronic product 99 is connected to an input of the load switch 107 of the wireless switch control device 10.

Reference is made to FIG. 1C, which is a block diagram of a wireless switch control device in an embodiment of the present disclosure. As shown in FIG. 1C, the wireless switch control device 10 is used to control a battery module 88 to supply power to two ends of an electronic product 99. The wireless switch control device 10 includes a wireless control circuit 101, a vibration sensor 103, an antenna 105, a load switch 107, and a power conversion circuit 109. In an embodiment, the wireless control circuit 101 may include a BLE system on chip (BLE SoC).

The wireless control circuit 101 may transmit a Bluetooth wireless signal to a mobile communication device 77 via the antenna 105 according to, for example, a Bluetooth communication standard. In an embodiment, the wireless control circuit 101 may also be a wireless communication circuit that supports the use of a ZigBee or Wi-Fi protocol, but the present disclosure is not limited thereto.

The vibration sensor 103 is operated based on basic principles of both gravity and acceleration. The acceleration is a space vector. Therefore, on one hand, to accurately learn a state of motion of an object, it is required to measure components of the object on three axes. On the other hand, without knowing a moving direction of the object beforehand, the only way is to use the vibration sensor 103 to detect an acceleration signal. In an embodiment, the vibration sensor 103 is a triaxial accelerometer, but the present disclosure is not limited thereto.

The load switch 107 can be used to connect/disconnect the wireless switch control device to/from the battery module 88. In an embodiment, the load switch 107 can also be used to monitor a current consumption in a circuit.

In an embodiment, the power conversion circuit 109 is a boost converter capable of voltage conversion and instantly starting the voltage, which has a high ability to instantly boost the voltage and achieves a desired boosting effect. In an embodiment, the power conversion circuit 109 is applicable to a 1.5V dry battery or 3.7V rechargeable battery of the same size. In another instance, the power conversion circuit 109 is a buck converter or a buck-boost converter, which is used to convert an input voltage into an appropriate working voltage. However, the present disclosure is not limited thereto.

The antenna 105 may communicate with the mobile communication device 77 to control the battery module 88 to supply power to the electronic product 99.

Particularly, the wireless control circuit 101 is electrically connected to the antenna 105, the vibration sensor 103, the power conversion circuit 109, and the load switch 107 separately. The load switch 107 is electrically connected to the battery module 88 and the electronic product 99 separately. The power conversion circuit 109 is electrically connected to the battery module 88 and the vibration sensor 103 separately.

In an embodiment, the battery module 88 is formed by two 1.5V dry batteries or 3.7V rechargeable batteries being connected in series. The anode of the battery module 88 is fitted with two metal sheets 102A and 102B, and the cathode of the battery module 88 is fitted with one metal sheet 102C. The metal sheets 102A and 102B are insulated from each other and there is no conduction therebetween. The metal sheet 102A is electrically connected to the load switch 107, and the metal sheet 102B is electrically connected to the load switch 107 and the power conversion circuit 109 separately. The metal sheet 102C is coupled to the wireless control circuit 101 of the wireless switch control device 10 and is connected to a grounding point.

In an embodiment, the wireless switch control device 10 and the battery module 88 may also be integrated to form a Bluetooth tracker. Therefore, the product of the present disclosure is already provided with a battery, the product of the present disclosure has a tracking function without changing the exterior of the product. The product of the present disclosure may further serve as a power switch.

Referring to FIG. 1A and FIG. 1C, a wireless switch control device 10' is arranged outside a battery module 88, and is used to control power supply from the battery module 88 to an electronic product 99. The wireless switch control device 10' includes an FPC board 51A, a load switch 107, and a wireless control circuit 101.

The FPC board 51A has a first electrode region E1, a second electrode region E2, and a component placement region 66. Particularly, the first electrode region E1 can be in electrical contact with an anode of the battery module 88, and the second electrode region E2 can be in electrical contact with a cathode of the battery module 88.

The load switch 107 is provided in the component placement region 66, and is coupled to a power supply circuit between the battery module 88 and the electronic product 99.

The wireless control circuit 101 is provided in the component placement region 66, and is coupled to both the load switch 107 and the anode of the battery module 88. Particularly, the wireless control circuit 101 wirelessly receives a setting instruction, and controls the load switch 107 according to the setting instruction.

In an embodiment, the first electrode region E1 is provided with a first metal sheet 102A and a second metal sheet 102B. One end of the second metal sheet 102B is coupled to the anode of the battery module 88, and the other end thereof is coupled to a first end of the load switch 107 and a positive input end of the component placement region 66. One end of the first metal sheet 102A is coupled to a second end of the load switch 107 of the wireless control circuit 101, and the other end thereof is coupled to a positive input end of the electronic product 99.

The second electrode region E2 is provided with a third metal sheet 102C. One end of the third metal sheet 102C is electrically connected to the cathode of the battery module 88, and the other end thereof is coupled to a grounding terminal of the component placement region 66. Particularly, the wireless control circuit 101 obtains a battery voltage provided by the battery module 88 through the positive input end and the grounding terminal of the component placement region 66.

In an embodiment, an insulating part 1021 is provided between two adjacent sides of the first metal sheet 102A and the second metal sheet 102B. The first, second, and third metal sheets 102A, 102B, and 102C are magnetic metal sheets. The wireless control circuit 101 is a wireless communication circuit that supports the use of a Bluetooth, ZigBee, or Wi-Fi protocol.

In an embodiment, the component placement region 66 in FIG. 1C is further provided with a power conversion circuit 109 coupled to the wireless control circuit 101, and a vibration sensor 103 coupled to the wireless control circuit 101 and the power conversion circuit 109.

Particularly, the power conversion circuit 109 converts a battery voltage provided by the battery module 88 into a working voltage provided for the wireless control circuit 101 and the vibration sensor 103.

Particularly, after connecting to a mobile communication device 77, the wireless control circuit 101 receives a setting instruction provided by an application program (APP) in the mobile communication device 77. Upon receipt of the setting instruction, the wireless control circuit 101 may control, according to the setting instruction, the load switch 107 to be switched on for a preset duration and then be automatically switched off.

Without a connection to the mobile communication device 77, the wireless control circuit 101 enters a sleep mode. Afterwards, when the battery voltage provided by the battery module 88 is greater than a default voltage and the vibration sensor 103 senses vibration, the wireless control circuit 101 performs broadcasting so as to establish the connection to the mobile communication device 77. However, when the battery voltage provided by the battery module 88 is less than the default voltage, the wireless control circuit 101 controls the load switch 107 to be switched off to cut off the power supply circuit between the battery module 88 and the electronic product 99.

Figure 2:
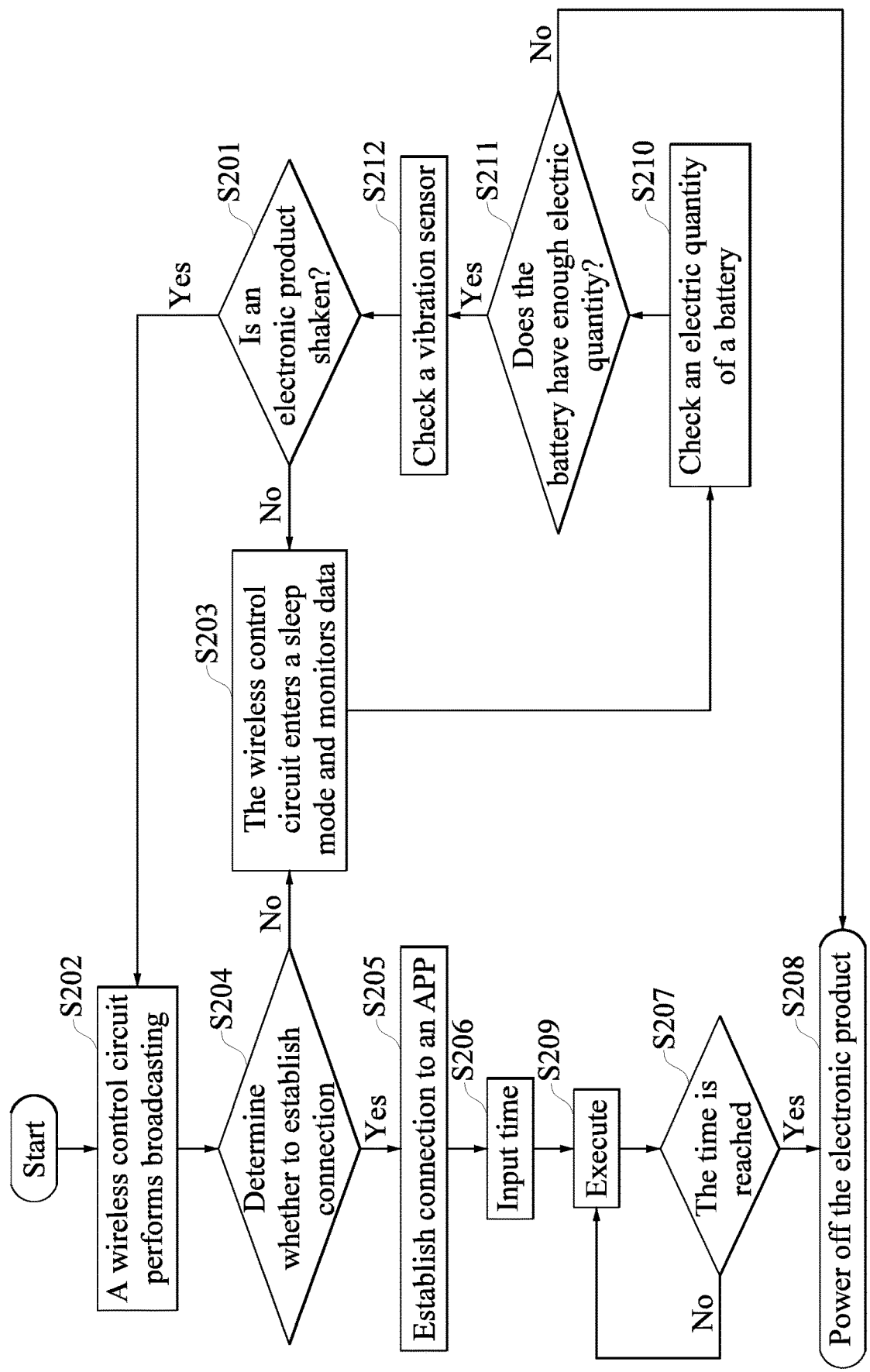
FIG. 2 is a flowchart of using the wireless switch control device to control a battery to supply power to an electronic product according to an embodiment of the present disclosure.

Referring to FIG. 1C and FIG. 2, FIG. 2 is a flowchart of using the wireless switch control device 10 to control a battery to supply power to the electronic product 99 according to an embodiment of the present disclosure. As shown in FIG. 1C, the wireless switch control device 10 includes a wireless control circuit 101, a vibration sensor 103, an antenna 105, a load switch 107, and a power conversion circuit 109, and is used to control the battery module to supply power to the electronic product 99.

In an embodiment, the wireless control circuit 101 is electrically connected to the antenna 105, the vibration sensor 103, the power conversion circuit 109, and the load switch 107 separately. The load switch 107 is electrically connected to the battery module 88 and the electronic product 99 separately. The power conversion circuit 109 is electrically connected to the battery module 88 and the vibration sensor 103 separately. The load switch 107 is coupled to a power supply circuit between the battery module 88 and the electronic product 99.

In step S201, after the wireless control circuit 101 is activated, it is determined, according to an output from the vibration sensor 103, whether the wireless control circuit 101 is shaken. If yes, step S202 is performed; or if not, step S203 is performed.

In step S202, the vibration sensor 103 is shook under an external force, and sends a broadcast request to the wireless control circuit 101; upon receipt of the broadcast request, the wireless control circuit 101 performs broadcasting via the antenna 105.

In step S203, when no broadcast request is received within default time, the wireless control circuit 101 enters a sleep mode and monitors data from the load switch 107. That is, when the vibration sensor 103 determines that the wireless control circuit 101 is not shaken, the wireless control circuit 101 monitors a real-time power consumption of the battery module 88 via the load switch 107 (step S210).

In an embodiment, the wireless control circuit 101 enters a sleep mode when the wireless control circuit 101 is not connected to a mobile communication device 77.

In an embodiment, after entering a sleep mode, when the wireless control circuit 101 determines that a battery voltage provided by the battery module 88 is less than a default voltage, the wireless control circuit 101 controls the load switch 107 to be switched off, so as to cut off the power supply circuit between the battery module 88 and the electronic product 99.

In an embodiment, after entering a sleep mode, when the wireless control circuit 101 determines that a battery voltage provided by the battery module 88 is greater than a default voltage, and senses vibration via the vibration sensor 103, the wireless control circuit 101 performs broadcasting so as to establish the connection to the mobile communication device 77.

In step S204, when the vibration sensor 103 determines that the wireless control circuit 101 is shaken, the wireless control circuit 101 performs broadcasting via the antenna 105, and attempts to match an APP in the mobile communication device 77 to establish the connection. If the wireless control circuit 101 succeeds in establishing the connection to the APP, step S205 is performed; otherwise, step S203 is performed. That is, when the vibration sensor 103 determines that the wireless control circuit 101 is not shaken, the wireless control circuit 101 monitors a real-time power consumption of the battery module 88 via the load switch 107.

In step S205, upon connecting to the APP, the wireless control circuit 101 controls, via the load switch 107, the battery module 88 and the electronic product 99 to maintain a conductive connection.

In an embodiment, when a first electrode region E1 and a second electrode region E2 of an FPC board 51A are respectively coupled to an anode and a cathode of the battery module 88, the wireless control circuit 101 wirelessly receives a setting instruction from an APP in the mobile communication device 77.

In step S206, a user may send a setting instruction via the APP to set default shutdown time, and executes the setting, so as to determine, via the load switch 107 in real time, whether the battery module 88 and the electronic product 99 maintain a conductive connection (step S209).

In an embodiment, the user may set a power supply duration of the battery module 88 to, for example, 30 min; and then control, via the load switch 107, the battery module 88 and the electronic product 99 to be disconnected. In this case, the electronic product 99 is powered off and cannot be used.

In an embodiment, after connecting to the mobile communication device 77, the wireless control circuit 101 obtains the setting instruction from the mobile communication device 77, and controls, according to the setting instruction, the load switch 107 to be switched on for a preset duration and then be automatically switched off.

In step S207, the wireless control circuit 101 determines whether the default shutdown time is reached, and if yes, the connection between the battery module 88 and the electronic product 99 via the load switch 107 is disabled, so that the electronic product 99 is powered off (step S208); or if not, the process returns to step S207.

In step S210, the wireless control circuit 101 monitors a real-time power consumption of the battery module 88 via the load switch 107, and compares the monitored power consumption with a full electric quantity of the battery module 88, to check a real-time electric quantity of the battery module 88 (step S211). When the real-time electric quantity is less than a preset electric quantity, step S208 is performed to power off the electronic product 99; otherwise, step S212 is performed to determine the output from the vibration sensor 103.

In an embodiment, when learning via the load switch 107 that the real-time power consumption of the battery module 88 reaches a first threshold corresponding to the real-time power consumption, or when learning that a total power consumption obtained by accumulation of the real-time power consumption after the wireless control circuit 101 is activated reaches a second threshold corresponding to the total power consumption, the wireless control circuit 101 disables the connection between the battery module 88 and the electronic product 99 via the load switch 107, so as to avoid electrolyte leakage from the battery module 88 after it is placed in a conduction mode in a battery compartment of the electronic product 99 for a long time.

In an embodiment, when learning via the load switch 107 that the real-time power consumption of the battery module 88 reaches an upper-limit value (a surge), the wireless control circuit 101 disables the connection between the battery module 88 and the electronic product 99 via the load switch 107, so as to protect the electronic product 99.

In an embodiment, when learning via the load switch 107 that the real-time power consumption of the battery module 88 reaches a first threshold and the battery module has an excessively low electric quantity, the wireless control circuit 101 disables the connection between the battery module 88 and the electronic product 99 via the load switch 107, and sends a prompt message via the antenna 105 to prompt a user to replace the battery, so as to timely take the battery out of the electronic product 99 to avoid electrolyte leakage.

In an embodiment, the wireless control circuit 101 learns, via the load switch 107, a real-time power consumption of the battery module 88 or a total power consumption obtained by accumulation of the real-time power consumption after the wireless control circuit 101 is started, to measure a total power consumption of the electronic product 99. The wireless control circuit 101 further determines, according to the total power consumption of the electronic product 99, whether the electronic product 99 is abnormal, and meanwhile estimates the standby time of the electronic product 99.

Figure 3:
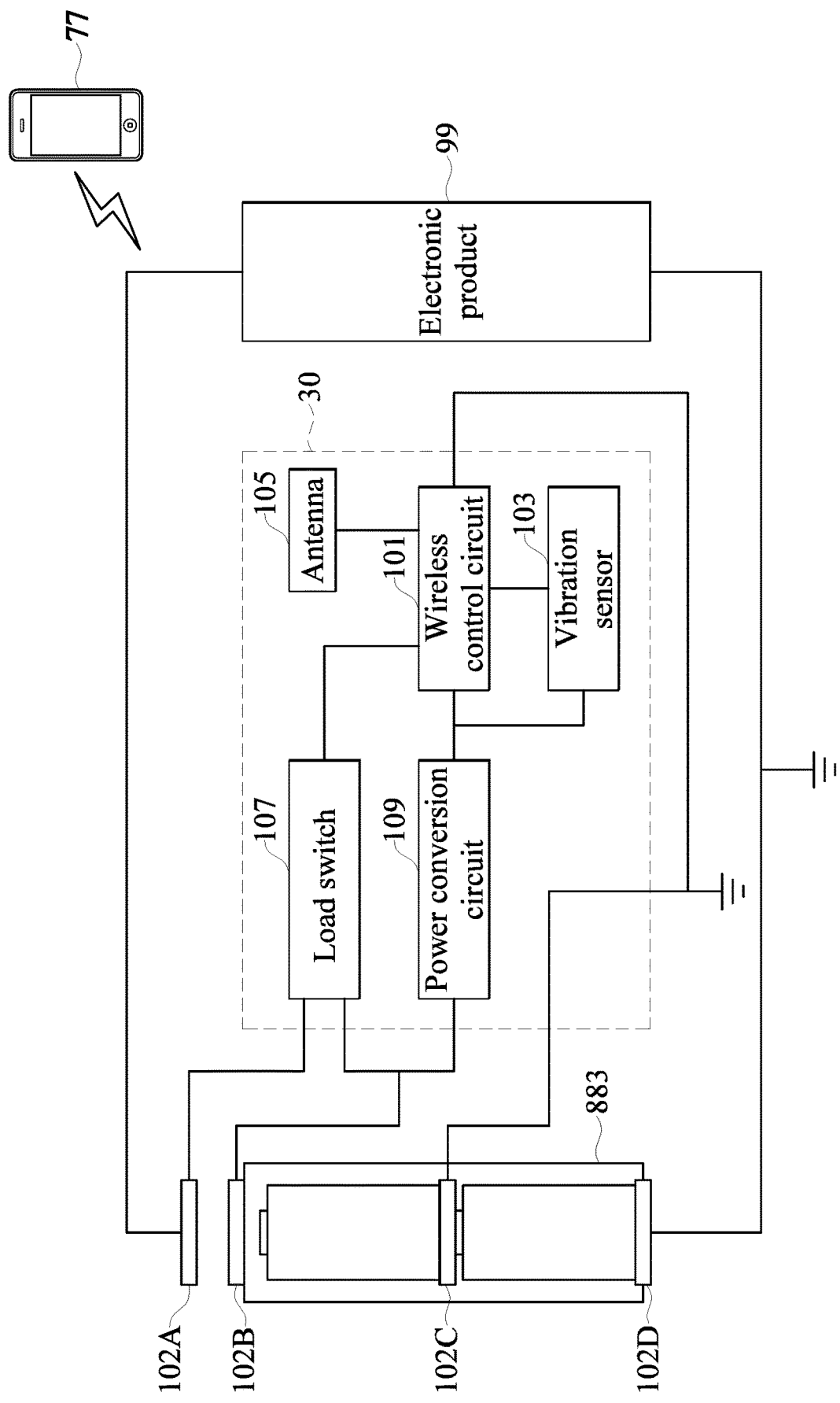
FIG. 3 is a block diagram of the wireless switch control device according to an embodiment of the present disclosure.

FIG. 3 is a block diagram of the wireless switch control device according to an embodiment of the present disclosure. As shown in FIG. 3, the wireless switch control device 30 is used to control a battery module 883 to supply power to two ends of an electronic product 99. The wireless switch control device 30 includes a wireless control circuit 101, a vibration sensor 103, an antenna 105, a load switch 107, and a power conversion circuit 109.

Particularly, the wireless control circuit 101 is electrically connected to the antenna 105, the vibration sensor 103, the power conversion circuit 109, and the load switch 107 separately. The load switch 107 is electrically connected to the battery module 883 and the electronic product 99 separately. The power conversion circuit 109 is electrically connected to the battery module 883 and the vibration sensor 103 separately.

The anode of the battery module 883 is fitted with two metal sheets 102A and 102B, and the cathode of the battery module 883 is fitted with two metal sheets 102C and 102D. There is no conduction between the metal sheets 102A and 102B. The metal sheet 102A is electrically connected to the load switch 107, and the metal sheet 102B is electrically connected to the load switch 107 and the power conversion circuit 109 separately. The metal sheet 102C is coupled to the wireless control circuit 101 of the wireless switch control device 30 and is connected to a grounding point, and the metal sheet 102D is coupled to the electronic product 99 and is connected to another grounding point.

In the embodiment shown in FIG. 3, based on an arrangement mode of the battery module 883, the wireless switch control device 30 is applicable to two 1.5V dry batteries or 3.7V rechargeable batteries connected in series, or a single 1.5V dry battery or 3.7V rechargeable battery.

Figure 4:
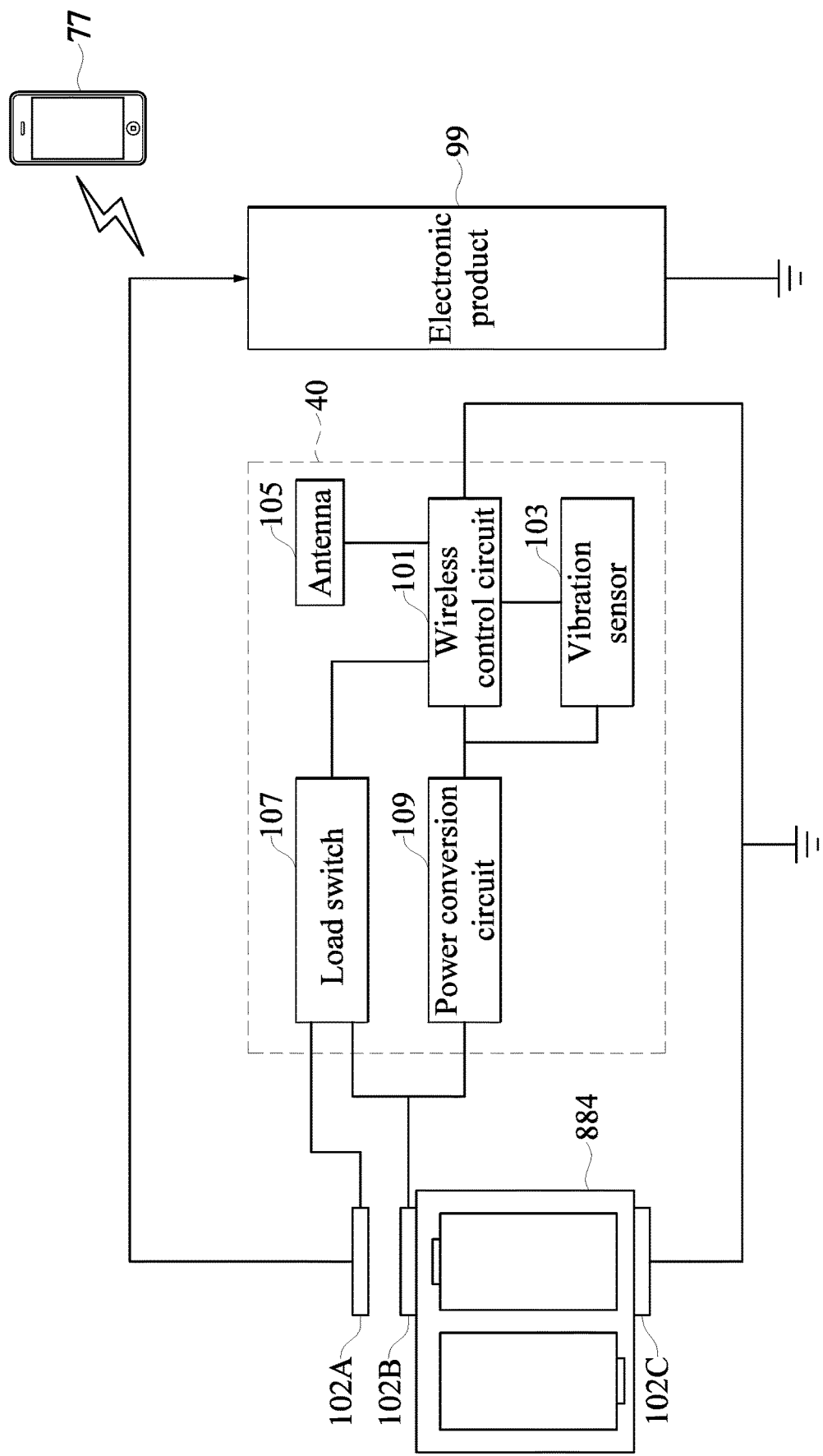
FIG. 4 is another block diagram of the wireless switch control device according to an embodiment of the present disclosure.

FIG. 4 is another block diagram of the wireless switch control device according to an embodiment of the present disclosure. As shown in FIG. 4, the wireless switch control device 40 is used to control a battery module 884 to supply power to two ends of an electronic product 99. The wireless switch control device 40 includes a wireless control circuit 101, a vibration sensor 103, an antenna 105, a load switch 107, and a power conversion circuit 109.

Particularly, the wireless control circuit 101 is electrically connected to the antenna 105, the vibration sensor 103, the power conversion circuit 109, and the load switch 107 separately. The load switch 107 is electrically connected to the battery module 884 and the electronic product 99 separately. The power conversion circuit 109 is electrically connected to the battery module 884 and the vibration sensor 103 separately.

The anode of the battery module 884 is fitted with two metal sheets 102A and 102B, and the cathode of the battery module 884 is fitted with one metal sheet 102C. There is no conduction between the metal sheets 102A and 102B. Based on an arrangement mode of the battery module 884, the wireless switch control device 40 is applicable to two 1.5V dry batteries or 3.7V rechargeable batteries connected in series, or a single 1.5V dry battery or 3.7V rechargeable battery. The wireless switch control device 40 is capable of being operated when clamped over either a left or right battery of the battery module 884. In other words, the battery module 884 has an input voltage of 1.5V to 3.0V. The power conversion circuit 109 is then used to convert the input voltage into a working voltage.

The metal sheet 102A is electrically connected to the load switch 107, and the metal sheet 102B is electrically connected to the load switch 107 and the power conversion circuit 109 separately. The metal sheet 102C is coupled to the wireless control circuit 101 of the wireless switch control device 40 and is connected to a grounding point, and one end of the electronic product 99 is connected to another grounding point.

Particularly, the wireless control circuit 101 is used to perform the following procedure. The vibration sensor 103 determines whether the wireless control circuit 101 is shaken. If yes, the wireless control circuit 101 of the wireless switch control device 40 performs broadcasting via the antenna 105 and establishes the connection to an APP of a mobile communication device 77. Upon connecting to the APP, the wireless control circuit 101 controls a power supply manner of the battery module 884 to the electronic product 99 via the load switch 107.

If not, the wireless control circuit 101 monitors a real-time power consumption of the battery module 884 via the load switch 107. When learning that the real-time power consumption of the battery module 884 reaches a corresponding first threshold or a total power consumption reaches a corresponding second threshold, the wireless control circuit 101 disables the connection between the battery module 884 and the electronic product 99 via the load switch 107.

Possible Technical Effects of the Embodiments

To sum up, made from an FPC board, the wireless switch control device of the present disclosure can be clamped over the anode and the cathode of a battery module and can also be fitted in a battery compartment. By different structural designs, the wireless switch control device of the present disclosure is applicable to a button cell, a single dry battery, or two dry batteries connected in series or parallel. Having a Bluetooth function, the wireless switch control device can control the battery module to supply power to the electronic product, so that the electronic product can be powered on/off wirelessly.

A wireless control circuit can communicate with a mobile communication device, and set the power supply duration to, for example, 30 min. After that, the wireless control circuit powers off the electronic product via the load switch, and the electronic product cannot be used. When the battery module has an excessively low electric quantity, the wireless control circuit powers off the electronic product via the load switch and prompts a user to replace the battery, so as to timely take the battery out of the electronic product to avoid electrolyte leakage. The wireless control circuit can measure a total power consumption of the electronic product via the load switch, so as to determine whether the electronic product is abnormal, and at the same time, estimate the standby time of the electronic product. The wireless control circuit can monitor a current consumption of the electronic product via the load switch, so as to power off the electronic product when its real-time power consumption has a surge.

The power conversion circuit can boost or buck an input voltage, and therefore is applicable to a 1.5V dry battery or a 3.7V rechargeable battery of the same size.

In addition, after the electronic product is shaken, the vibration sensor can trigger the wireless control circuit to perform broadcasting, so that the mobile communication device establishes the connection to the wireless control circuit to perform communication.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wireless switch control device, arranged outside of a battery module, and used to control power supply from the battery module to an electronic product, wherein the wireless switch control device comprises:
   a flexible printed circuit (FPC) board, having a first electrode region, a second electrode region, and a component placement region, wherein the first electrode region is in electrical contact with an anode of the battery module, the second electrode region is in electrical contact with a cathode of the battery module, the first electrode region is provided with a first metal sheet and a second metal sheet, and an insulating part is provided between two adjacent sides of the first metal sheet and the second metal sheet;
a load switch, provided in the component placement region, and coupled to a power supply circuit between the battery module and the electronic product;
a wireless control circuit, provided in the component placement region, and coupled to both the load switch and the anode of the battery module; and
a vibration sensor, provided in the component placement region, and coupled to the wireless control circuit;
wherein the wireless control circuit receives a setting instruction wirelessly, and controls the load switch according to the setting instruction;
wherein, when a battery voltage provided by the battery module is greater than a default voltage and the vibration sensor senses vibration, the wireless control circuit performs broadcasting so as to establish connection to a mobile communication device;
wherein the wireless control circuit receives a setting instruction provided by the mobile communication device after the wireless control circuit is connected to the mobile communication device, the wireless control circuit controls the load switch according to the setting instruction;
wherein, when the wireless control circuit controls the load switch to be switched on, the battery module is electrically connected to the electronic product;
wherein, when the wireless control circuit controls the load switch to be switched off, the battery module is not electrically connected to the electronic product.

2. The wireless switch control device of claim 1, wherein one end of the second metal sheet is coupled to the anode of the battery module, and another end thereof is coupled to a first end of the load switch and a positive input end of the component placement region; one end of the first metal sheet is coupled to a second end of the load switch of the wireless communication circuit, and another end thereof is coupled to a positive input end of the electronic product; the second electrode region is provided with a third metal sheet, one end of the third metal sheet is electrically connected to the cathode of the battery module, and the other end thereof is coupled to a grounding terminal of the component placement region; and the wireless control circuit obtains the battery voltage provided by the battery module through the positive input end and the grounding terminal of the component placement region.

3. The wireless switch control device of claim 2, wherein the first, second, and third metal sheets are magnetic metal sheets; and the wireless control circuit is a wireless communication circuit that supports the use of a Bluetooth®, ZigBee, or Wi-Fi protocol.

4. The wireless switch control device of claim 1, wherein the component placement region is further provided with:
a power conversion circuit coupled to the wireless control circuit;
wherein the vibration sensor is coupled to the power conversion circuit, and the power conversion circuit converts the battery voltage provided by the battery module into a working voltage provided for the wireless control circuit and the vibration sensor.

5. The wireless switch control device of claim 4, wherein the wireless control circuit enters a sleep mode when not connected to the mobile communication device, and afterwards, when the battery voltage provided by the battery module is less than the default voltage, the wireless control circuit controls the load switch to be switched off, so as to cut off the power supply circuit.

6. A wireless switch control method, applicable to a wireless switch control device arranged outside of a battery module, wherein the wireless switch control device is used to control power supply from the battery module to an electronic product, and includes a flexible printed circuit (FPC) board, a load switch, a wireless control circuit, and a vibration sensor; the vibration sensor, the load switch and the wireless control circuit being provided in a component placement region of the FPC board, and the load switch being coupled to a power supply circuit between the battery module and the electronic product, the method comprising:
performing broadcasting, by the wireless control circuit, so as to establish connection to a mobile communication device when a battery voltage provided by the battery module is greater than a default voltage and the vibration sensor senses vibration;
wirelessly receiving, by the wireless control circuit, a setting instruction after the wireless control circuit is connected to the mobile communication device; and
controlling, by the wireless control circuit, the load switch according to the setting instruction;
wherein, when the wireless control circuit controls the load switch to be switched on, the battery module is electrically connected to the electronic product;
wherein, when the wireless control circuit controls the load switch to be switched off, the battery module is not electrically connected to the electronic product.

7. The method of claim 6, further comprising:
entering, by the wireless control circuit, a sleep mode when the wireless control circuit is not connected to the mobile communication device.

8. The method of claim 7, further comprising:
after the wireless control circuit enters a sleep mode and determines that the battery voltage provided by the battery module is less than the default voltage, controlling, by the wireless control circuit, the load switch to be switched off, so as to cut off the power supply circuit.

* * * * *